(12) United States Patent
Oka et al.

(10) Patent No.: US 6,790,705 B2
(45) Date of Patent: Sep. 14, 2004

(54) MANUFACTURING METHOD FOR SEMICONDUCTOR APPARATUS

(75) Inventors: Junji Oka, Habikino (JP); Shigenori Kitanishi, Tenri (JP); Toshiharu Nishi, Mie (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/236,264

(22) Filed: Sep. 5, 2002

(65) Prior Publication Data

US 2003/0060023 A1 Mar. 27, 2003

(30) Foreign Application Priority Data

Sep. 5, 2001 (JP) ..................................... P2001-269103

(51) Int. Cl.[7] .......................... H01L 21/44; H01L 21/48; H01L 21/50
(52) U.S. Cl. ....................... 438/113; 438/462; 438/465; 438/976
(58) Field of Search ................................. 438/110, 113, 438/125, 120, 460, 462, 465, 976

(56) References Cited

U.S. PATENT DOCUMENTS 5,393,706 A * 2/1995 Mignardi et al. .............. 225/2
5,521,125 A * 5/1996 Ormond et al. ............. 438/465
6,489,178 B2 * 12/2002 Coyle et al. .................. 438/51

FOREIGN PATENT DOCUMENTS

JP  2000-124344  4/2000

\* cited by examiner

*Primary Examiner*—David A. Zarneke
(74) *Attorney, Agent, or Firm*—David G. Conlin; Steven M. Jensen; Edwards & Angell, LLP

(57) ABSTRACT

Provided is a semiconductor apparatus manufacturing method capable of severing a base material without producing burrs. A multiplicity of semiconductor apparatuses are produced as follows. A multi-segment base material is obtained by mounting a multiplicity of semiconductor chips on a substrate having a wiring pattern, followed by sealing the semiconductor chips with resin, further followed by attaching a terminal portion having a terminal hole to a back surface of the substrate. A filler is charged in each terminal hole, and, after curing the filler, the base material is severed along a cutting line covering the terminal hole, whereupon the multi-segment base material is divided into separate semiconductor apparatuses. The terminal hole is left exposed along the cut surface of the semiconductor apparatus. Chilled water is applied to the filler filled in the terminal hole to remove it from the terminal hole.

7 Claims, 14 Drawing Sheets

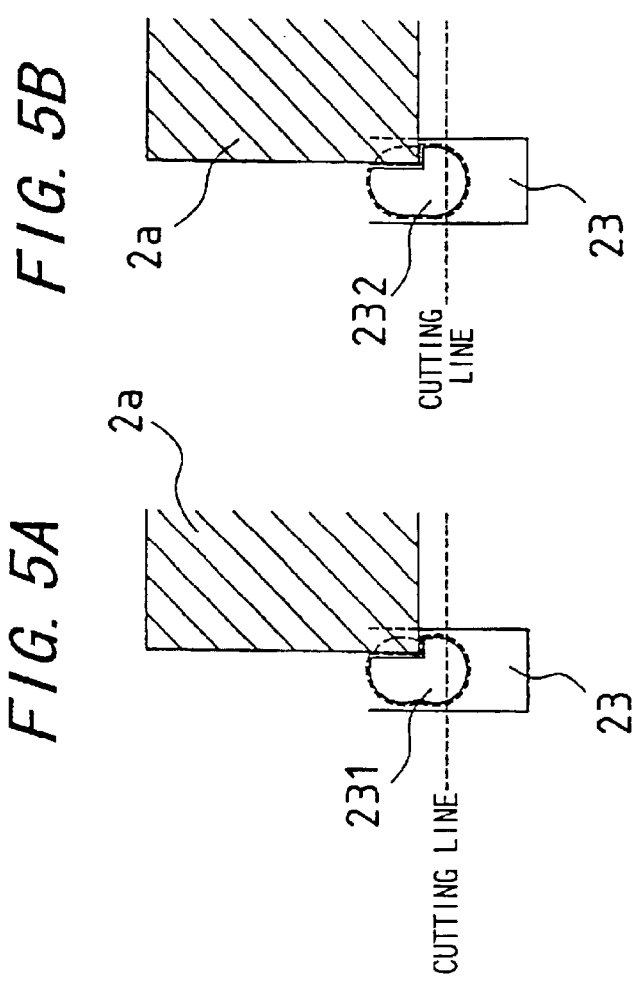

MANUFACTURING METHOD FOR SEMICONDUCTOR APPARATUS

BACKGROUND OF THE INVENTION

1. Field of the Invention

The present invention relates to a method for manufacturing a semiconductor apparatus, and more particularly to a method for manufacturing a semiconductor apparatus whereby a divisible multi-segment base material is formed and severed at predetermined cutting positions to obtain separate semiconductor apparatuses.

2. Description of the Related Art

A semiconductor apparatus is typically produced by severing a divisible multi-segment base material on which a multiplicity of semiconductor chips are mounted, at predetermined cutting positions.

With reference to FIGS. 8A through 8C, 9A, and 9B, a semiconductor apparatus of conventional design will be described below. FIGS. 8A through 8C are a plan view, a front view, and a bottom view, respectively, each showing a divisible multi-segment base material. FIG. 9A is an enlarged view showing a section D depicted in FIG. 8A. FIG. 9B is an enlarged view showing a section E depicted in FIG. 8C.

On a top-surface side of a substrate 90 is formed a wiring pattern (not shown) having mounted thereon a multiplicity of semiconductor chips (not shown). The wiring pattern has its surface sealed with resin 92, and also the semiconductor chips, together with the resin 92, are sealed with upper resin 92b. The wiring pattern and the semiconductor chips are electrically connected to each other by a gold wire (not shown).

On a back-surface side of the substrate 90 is formed a terminal portion 93 which is given plating so as to pair up with each of the semiconductor chips. In the terminal portion 93 is formed a terminal hole 931 to establish external electrical connection.

In this way, the divisible multi-segment base material 9 is obtained by forming the wiring pattern including a multiplicity of semiconductor chips on the substrate 90, followed by providing the terminal portion 93 thereon.

Next, with reference to FIGS. 8A through 8C, 9A, 9B, 10A, 10B, and 11A through 11C, a detailed description will be given below as to a process for dividing the above-described divisible multi-segment base material 9 into separate semiconductor apparatuses 91. FIGS. 10A and 10B are views each showing a process step for producing the semiconductor apparatus 91. FIGS. 11A through 11C are a plan view, a front view, and a bottom view, respectively, each showing the semiconductor apparatus 91 in finished form. Note that the "cutting line" shown in FIGS. 8A through 8C and FIG. 9A represents a cutting position at which the base material 9 is severed with a dicing machine provided with a blade 9a as shown in FIG. 9B.

The base material 9 shown in FIG. 10A is severed by moving the blade 9a, provided in the dicing machine, along the cutting line covering the terminal hole 931. By being severed along the cutting line, the divisible multi-segment base material 9 is cut into pieces, thus producing a multiplicity of semiconductor apparatuses 91 as shown in FIGS. 11A through 11C. Note that, as shown in FIGS. 10B, 11B, and 11C, the terminal hole 931 is left exposed along the cut surface of each of the separate semiconductor apparatuses 91.

However, a multiplicity of semiconductor apparatuses 91 thus produced suffer from the following drawbacks. Since the base material 9 is severed along the cutting line covering the terminal hole 93, the plating applied to the terminal hole 931 inconveniently comes off, resulting in burrs being developed. Occurrence of burrs in the terminal hole 931 leads to soldering failure, or causes short circuits between the terminals.

Furthermore, where the blade provided in the dicing machine is so designed as to perform 1-line cutting at one time (hereafter such a blade is referred to as the "single-type blade 9b"), the number of cutting process steps is increased. As a method to reduce the number of cutting process steps, it is known to use a blade capable of cutting a plurality of lines at one time (hereafter such a blade is referred to as the "multiple-type blade 9c") for severing the base material 9. FIG. 12A is a view showing a state in which the base material 9 is being severed by the single-type blade 9b, and FIG. 12B is a view showing a state in which the base material 9 is being severed by the multiple-type blade 9c. As shown in FIGS. 12A and 12B, the multiple-type blade 9c is made 10 times as thick as the single-type blade 9b. For example, if the thickness of the single-type blade is assumed to be 0.1 to 0.2 mm, the multiple-type blade has a thickness of approximately 2 mm.

In the multiple-type blade 9c, though a plurality of lines can be cut at one time, a heavier load is required for cutting than in the case of performing cutting line by line. For this reason, the multiple-type blade 9c is made larger in thickness than the single-type blade 9b. Since a limitation is imposed on a range of selection of surface particle sizes for the multiple-type blade 9c, the multiple-type blade 9c is disadvantageous in terms of burr amount compared to the single-type blade 9b.

SUMMARY OF THE INVENTION

To solve the above-described problems, an object of the invention is to provide a semiconductor apparatus manufacturing method by which burrs can be prevented from being produced along a cut surface of a terminal portion at the time of severing a base material.

The invention provides a semiconductor apparatus manufacturing method comprising the steps of:

forming a divisible multi-segment base material by mounting a multiplicity of semiconductor chips on a top-surface side of a substrate having a wiring pattern, followed by sealing the semiconductor chips with resin, further followed by attaching terminal portions each having a terminal hole to a back-surface side of the substrate; and severing the base material at a position covering the terminal hole in such a way that the base material is divided into separate semiconductor apparatuses, wherein, after formation of the base material, a filler is charged in each of the terminal holes, then the base material is severed after curing the filler, and lastly the filler filled in each of the terminal holes is removed.

According to the invention, after formation of the base material, a filler is charged in each of the terminal holes. Then, the base material is severed after curing the filler. With this method, even if a multiple-type blade is used, it is possible to prevent burrs from being produced along the cut surface of the terminal portion at the time of severing the base material. Moreover, the filler used to prevent occurrence of burrs is removed just after the severing, thus leaving no unnecessary components in the semiconductor apparatus.

In the invention, it is preferable that the filler contains a water-soluble substance.

According to the invention, the filler, containing a water-soluble substance, can be readily removed from the semiconductor apparatus with use of water.

In the invention, it is preferable that the water-soluble substance consists of barium hydroxide or polyvinyl alcohol.

In the invention, it is preferable that the filler contains an alkali-strippable substance.

According to the invention, the filler, containing an alkali-strippable substance, can be readily removed from the semiconductor apparatus with use of alkaline aqueous solution.

In the invention, it is preferable that the filler contains a thermosetting substance or an ultraviolet cure substance.

In the invention, it is preferable that the terminal hole is formed by drilling a plurality of continuous holes.

According to the invention, since the terminal hole is formed by drilling a plurality of continuous holes, its hole diameter is made larger than that of a terminal hole consisting of a single hole. As a result, even if the position at which the base material is severed is so located as to be deviated to the cutout-portion side with respect to a predetermined cutting position, the base material can be cut into separate semiconductor apparatuses without peeling off a plating applied to the terminal hole.

In the invention, it is preferable that the terminal hole is shaped like a slot.

According to the invention, the terminal hole is made larger in diameter than the above-mentioned terminal hole. Thus, even if the position at which the base material is severed is so located as to be deviated to the cutout-portion side with respect to a predetermined cutting position, the base material can be cut into separate semiconductor apparatuses without peeling off a plating applied to the terminal hole.

In the invention, it is preferable that the base material is severed in such a way that one part of the terminal hole removed as a result of severing the base material is made larger in volumetric capacity than the other part thereof remaining on the semiconductor apparatus.

According to the invention, one part of the terminal hole removed as a result of severing the base material is made larger in volumetric capacity than the other part thereof remaining on the semiconductor apparatus. Thus, even if the position at which the base material is severed is so located as to be deviated to the cutout-portion side with respect to a predetermined cutting position, the base material can be cut into separate semiconductor apparatuses without peeling off a plating applied to the terminal hole. This makes it possible to prevent burrs from being produced along the cut surface of the terminal portion at the time of severing the base material.

The invention further provides a semiconductor apparatus manufacturing method comprising the steps of:

forming a divisible multi-segment base material by mounting a multiplicity of semiconductor chips on a top-surface side of a substrate having a wiring pattern, followed by sealing the semiconductor chips with resin, further followed by attaching terminal portions each having a terminal hole to a back-surface side of the substrate; and severing the base material at a position covering the terminal hole in such a way that the base material is divided into separate semiconductor apparatuses, wherein, after formation of the base material, an electrically conductive substance is charged in each of the terminal holes, and the base material is severed after curing the electrically conductive substance.

The invention still further provides a semiconductor apparatus comprising:

a substrate;

a wiring pattern emplaced on a top-surface side of the substrate;

a semiconductor chip mounted on the top-surface side of the substrate;

resin for sealing the wiring pattern and the semiconductor chip; and a terminal portion disposed on a back-surface side of the substrate, the terminal portion being given plating so as to pair up with the semiconductor chip, wherein in the terminal portion is formed a terminal hole to establish external electrical connection, and wherein the terminal hole is filled with a filler made of an electrically conductive substance.

According to the invention, after formation of the base material, an electrically conductive substance is charged in each of the terminal holes. Then, the base material is severed after curing the electrically conductive substance. Thus, it is possible to prevent burrs from being produced along the cut surface of the terminal portion at the time of severing the base material, and also to utilize the filler filled in the terminal hole to establish external connection.

BRIEF DESCRIPTION OF THE DRAWINGS

Other and further objects, features, and advantages of the invention will be more explicit from the following detailed description taken with reference to the drawings wherein:

FIG. 5A is a view of a base material having a terminal hole formed by drilling a plurality of continuous holes, which is used in the semiconductor apparatus manufacturing method according to a second embodiment of the invention, illustrating the case of severing the base material along a line located so as to be deviated to the cutout-portion side with respect to a predetermined cutting position;

FIG. 5B is a view of a base material having a slot-shaped terminal hole, which is used in the semiconductor apparatus manufacturing method according to the second embodiment of the invention, illustrating the case of severing the base material along a line located so as to be deviated to the cutout-portion side with respect to a predetermined cutting position;

FIG. 5C is a view of a base material having a circular terminal hole according to the invention, illustrating the case of severing the base material along a line located so as to be deviated to the cutout-portion side with respect to a predetermined cutting position;

DETAILED DESCRIPTION OF THE PREFERRED EMBODIMENTS

Figure 1A:
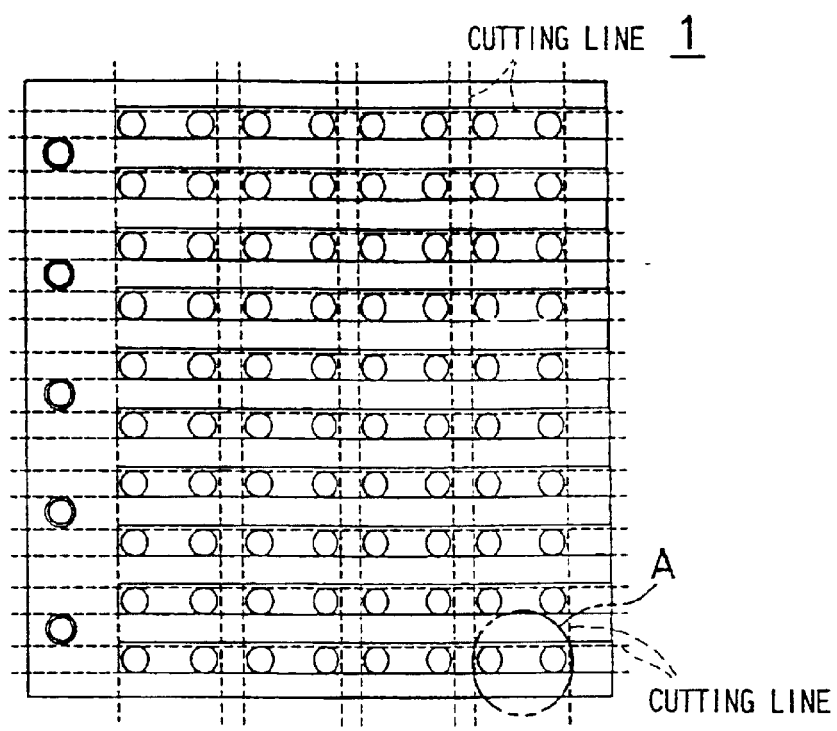
FIGS. 1A through 1C are views each showing a divisible multi-segment base material formed into a multiplicity of semiconductor apparatuses, which is used in a semiconductor apparatus manufacturing method according to a first embodiment of the invention.

Now referring to the drawings, preferred embodiments of the invention are described below.

First Embodiment

Figure 1B:
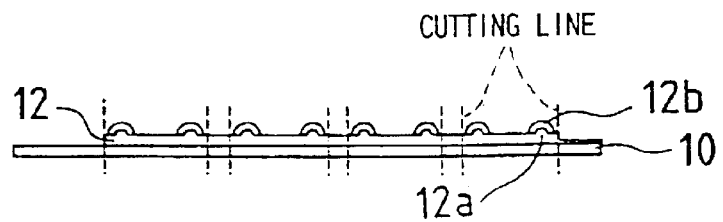
Figure 1C:
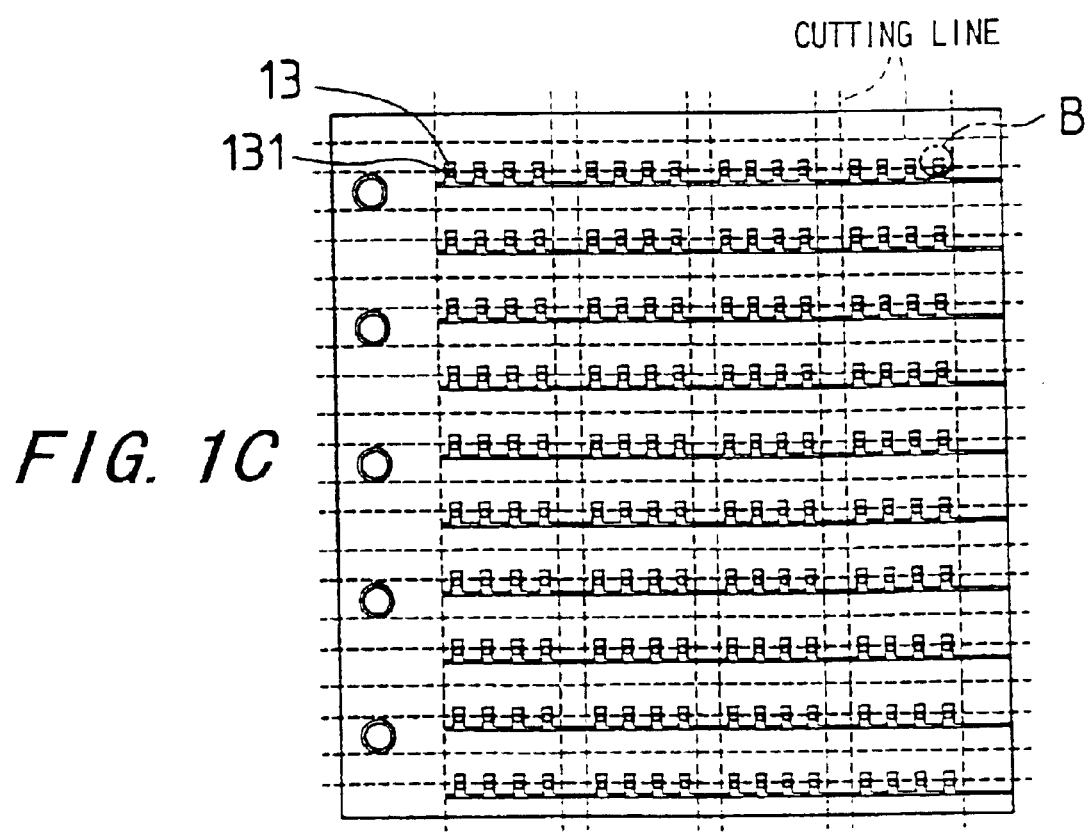
Figure 2A:
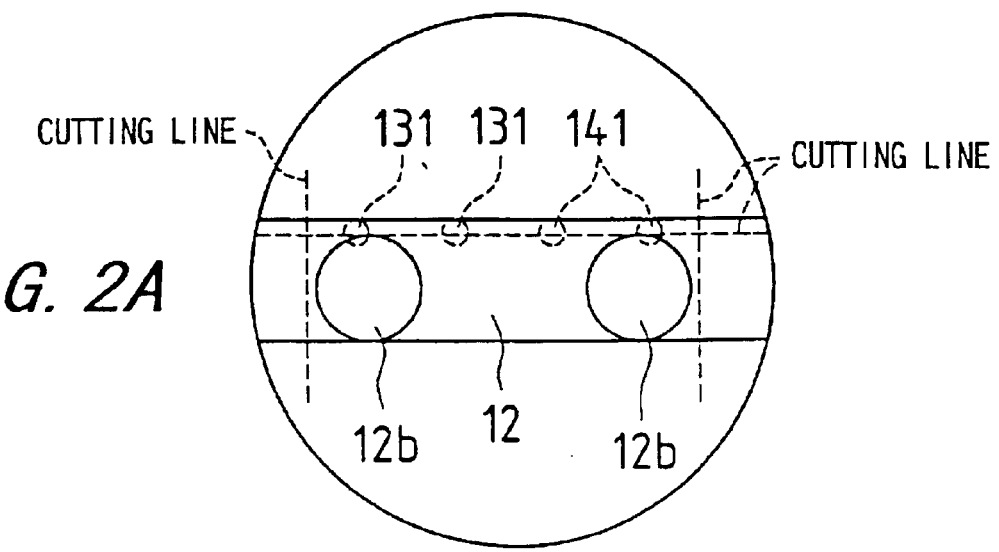
FIG. 2A is an enlarged view showing a section A depicted in FIG. 1A.
Figure 2B:
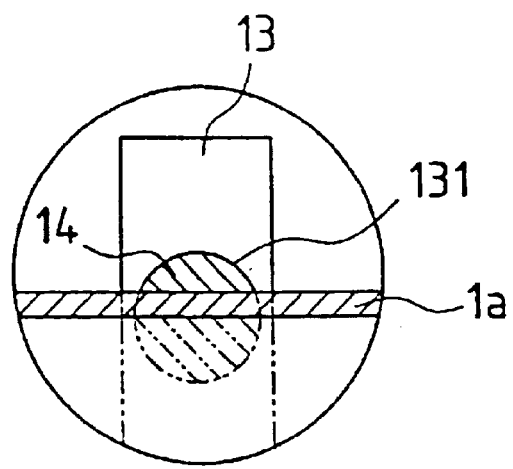
FIG. 2B is an enlarged view showing a section B depicted in FIG. 1C.

With reference to FIGS. 1A through 1C, 2A, and 2B, a description will be given below as to a semiconductor apparatus according to the first embodiment of the invention. FIGS. 1A through 1C are a plan view, a front view, and a bottom view, respectively, each showing a divisible multi-segment base material. FIG. 2A is an enlarged view showing a section A depicted in FIG. 1A. FIG. 2B is an enlarged view showing a section B depicted in FIG. 1C.

On a top-surface side of a substrate 10 is formed a wiring pattern (not shown) having mounted thereon a multiplicity of semiconductor chips (not shown). The wiring pattern has its surface sealed with resin 12. The resin 12 is molded into a thin-film, but its part located above each of a multiplicity of semiconductor chips mounted on the substrate 10 is formed as a convexity 12a. That is, a multiplicity of semiconductor chips are not completely covered with the resin 12. Thus, on the convexity 12a is additionally coated upper resin 12b to ensure sealing. The wiring pattern and the semiconductor chips are electrically connected to each other by a gold wire (not shown).

On a back-surface side of the substrate 10 is formed a terminal portion 13 which is given plating so as to pair up with each of the semiconductor chips. In the terminal portion 13 is formed a terminal hole 131 to establish external electrical connection.

In this way, a divisible multi-segment base material 1 is obtained by forming the wiring pattern including a multiplicity of semiconductor chips on the substrate 10, followed by providing the terminal portion 13 thereon.

As shown in FIG. 2B, the terminal hole 131 is filled with a filler 14. In the first embodiment of the invention, the filler 14 is made of a water-soluble substance consisting of barium hydroxide or polyvinyl alcohol, or a thermosetting substance which is cured by heating and water-evaporation. For example, a water-soluble hole filling ink is usable.

Although, in the first embodiment of the invention, a water-soluble substance is used as the filler 14, the filler 14 is not limited thereto, but may be of an alkali-strippable substance which is readily removed from an inner circumferential surface for constituting the terminal hole 131 with use of alkaline aqueous solution. Moreover, although a thermosetting substance is used as the filler 14, the filler 14 is not limited thereto, but may be of an ultraviolet cure substance which is cured by application of ultraviolet rays.

Figure 4A:
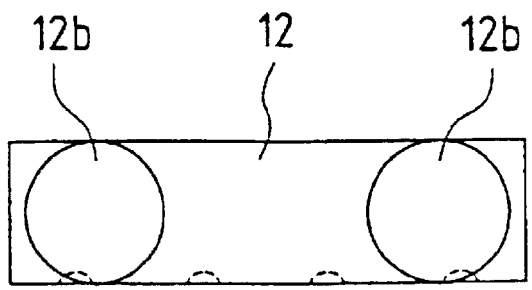
FIGS. 4A through 4C are views each showing the semiconductor apparatus according to the first embodiment of the invention.
Figure 4B:
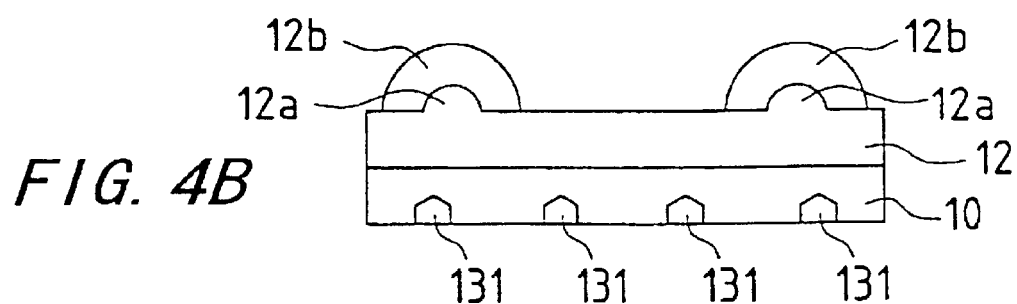
Figure 4C:
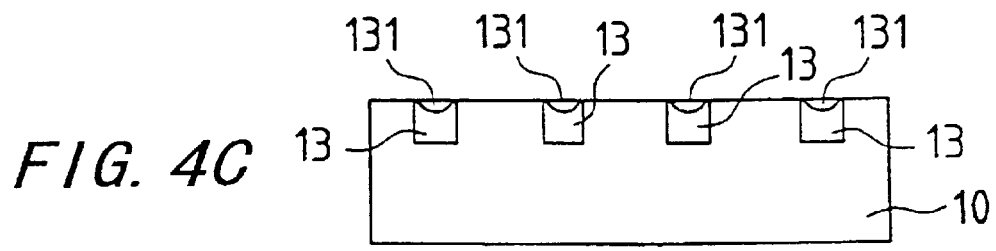
Figure 4D:
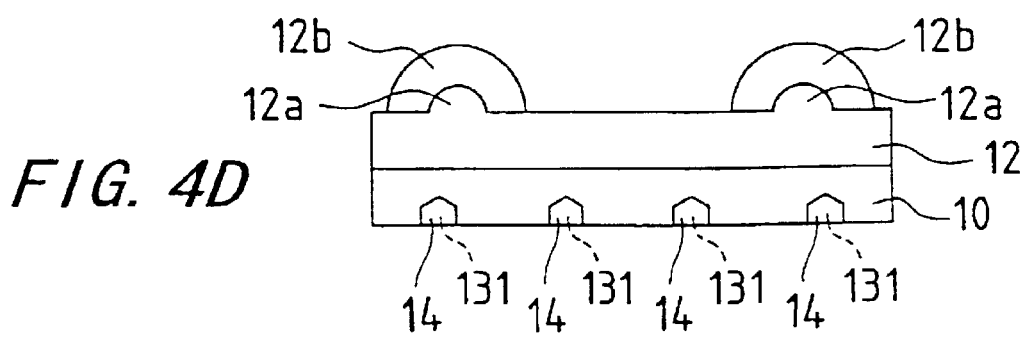
FIG. 4D is a view showing another example of the semiconductor apparatus according to the first embodiment of the invention.

Alternatively, an electrically conductive substance may be used as the filler 14. A preferred example thereof is solder. In this case, since the filler 14 exhibits conductivity, as shown in FIG. 4D, the filler 14 per se can be used to establish external connection.

Next, with reference to FIGS. 1A through 1C, 3A through 3D, and 4A through 4C, a detailed description will be given below as to a process for dividing the above-described divisible multi-segment base material 1 into separate semiconductor apparatuses 11. FIGS. 3A through 3D are views each showing a process step for producing the semiconductor apparatus 11. FIGS. 4A through 4C are a plan view, a front view, and a bottom view, respectively, each showing the semiconductor apparatus 11 in finished form. Note that the "cutting line" shown in FIGS. 1A through 1C represents a cutting position at which the divisible multi-segment base material 1 is severed with use of a cutting machine. In the first embodiment of the invention, used as the cutting machine is a dicing machine provided with a blade 1a as shown in FIG. 2B.

Figure 3A:
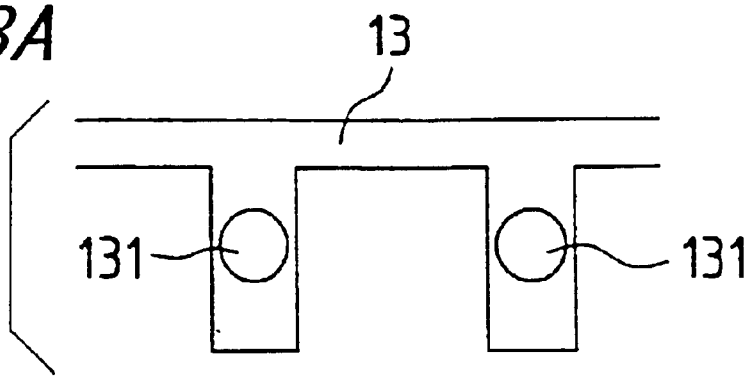
FIGS. 3A through 3D are views each showing a process step for manufacturing a semiconductor apparatus according to the first embodiment of the invention.
Figure 3B:
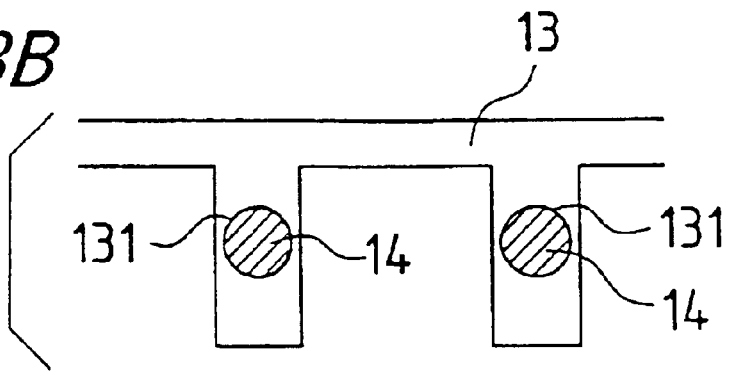
Figure 3C:
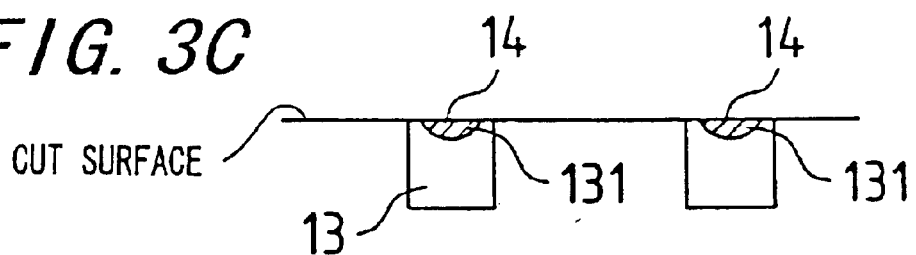
Figure 3D:
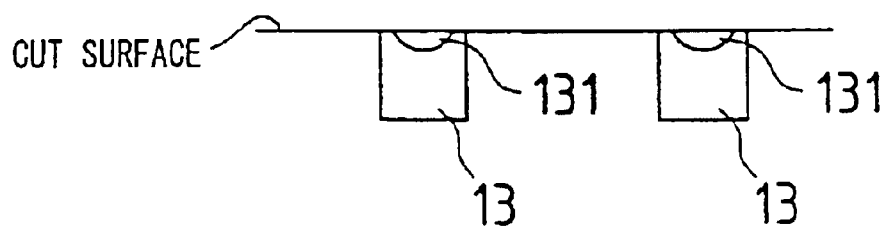

As shown in FIG. 3B, the filler 14 is charged in each of the terminal holes 131 shown in FIG. 3A. After the filler 14 charged is cured, the divisible multi-segment base material 1 is severed while the blade 1a incorporated in the dicing machine shown in FIG. 2B is performing scanning over a cutting line covering the terminal hole 131, as shown in FIG. 3C, that is, while the blade 1a is being moved along the cutting line. By being severed along the cutting line, the divisible multi-segment base material 1 is divided into separate semiconductor apparatuses 11. Note that the terminal hole 131 is left exposed along the cut surface of each of the separate semiconductor apparatuses 11. Then, chilled water is applied to the filler 14 filled in the terminal hole 131, whereupon the filler 14 is removed from the terminal hole 131 as shown in FIG. 3D. Eventually, a multiplicity of semiconductor apparatuses 11 as shown in FIGS. 4A through 4C are produced.

As described hereinabove, after formation of the base material 1, the filler 14 is charged in each of the terminal holes 131, and the base material 1 is severed after curing the filler 14. With this procedure, even if a multiple-type blade is used, it is possible to prevent burrs from being produced along the cut surface of the terminal portion 13. Moreover, the filler 14 used to prevent occurrence of burrs is removed just after the severing, thus leaving no unnecessary components in the semiconductor apparatus 11.

Second Embodiment

Next, the semiconductor apparatus according to the second embodiment of the invention will be described. It should be noted that the semiconductor apparatus of the second embodiment has basically the same structure as that of the first embodiment, the only difference being the shape of the terminal hole. Hence, the components that play the same or corresponding roles as in the first embodiment will be identified with the same reference symbols, and overlapping descriptions will be omitted.

On a top-side surface of a substrate 10 is formed a wiring pattern (not shown) having mounted thereon a multiplicity of semiconductor chips (not shown). The wiring pattern has its surface sealed with resin 12 and upper resin 12b.

On a back-surface side of the substrate 10 is formed a terminal portion 23 which is given plating so as to pair up with each of the semiconductor chips. In the terminal portion 23 is formed a terminal hole 231 in which a filler 14 is filled.

In this way, a divisible multi-segment base material 1 is obtained by forming the wiring pattern including a multiplicity of semiconductor chips on the substrate 10, followed by providing the terminal portion 23 thereon.

FIG. 5A is a view of a base material having a terminal hole 231 formed by drilling a plurality of continuous holes, which is used in the semiconductor apparatus manufacturing method according to the second embodiment of the invention, illustrating the case of severing the base material along a line located so as to be deviated to the cutout-portion side with respect to a predetermined cutting line, i.e., along a line which is offset from the cutting line and located in an unnecessary portion between the adjacent semiconductor apparatuses 21. As shown in FIG. 5A, the terminal hole 231 is formed by continuously drilling a plurality of terminal holes 131 of the first embodiment of the invention. In other words, the terminal hole 231 is formed by overlappingly arranging a plurality of terminal holes 131 side by side such that a center-to-center distance between the adjacent terminal holes 131 is shorter than the diameter of a single terminal hole 131. Thus, the terminal hole 231 is made larger in size than that of the first embodiment of the invention.

FIG. 5B is a view of the base material having a slot-shaped terminal hole 232, which is used in the semiconductor apparatus manufacturing method according to the second embodiment of the invention, illustrating the case of cutting the base material along a line located so as to be deviated to the cutout-portion side with respect to the cutting line covering the terminal hole 232.

Although, in the second embodiment, the terminal hole 231 is formed by continuously drilling a plurality of terminal holes 131 of the first embodiment of the invention, the shape of the terminal hole is not limited thereto. As shown in FIG. 5B, it is possible to employ the terminal hole 232 instead that is shaped like a slot by elongating the terminal hole 131 of the first embodiment of the invention.

Next, with reference to FIGS. 1A through 1C, 5A, and 6A through 6D, a detailed description will be given below as to a process for dividing the divisible multi-segment base material 1 into separate semiconductor apparatuses 21.

Figure 6A:
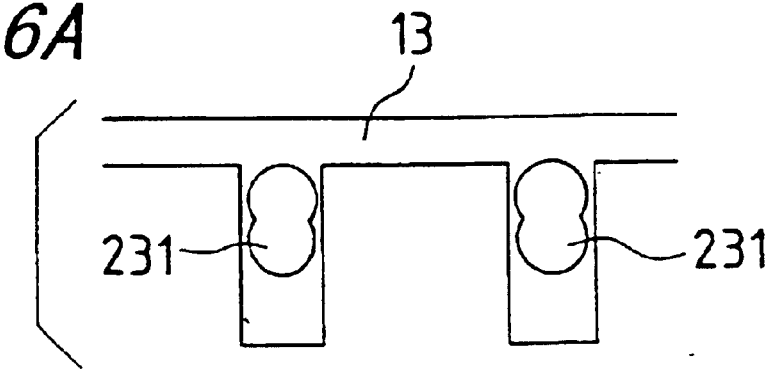
FIGS. 6A through 6D are views each showing a process step for manufacturing the semiconductor apparatus according to the second embodiment of the invention.
Figure 6B:
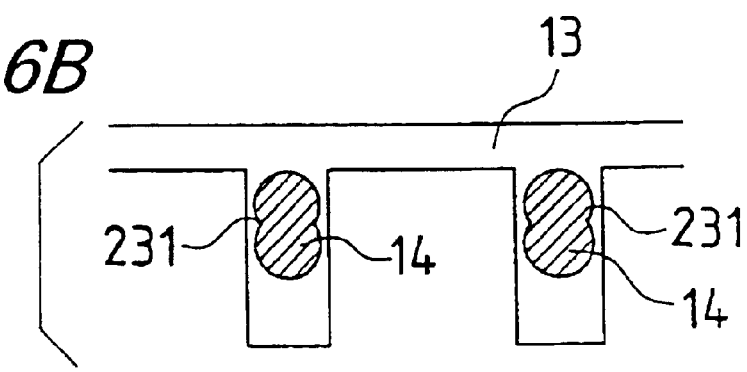
Figure 6C:
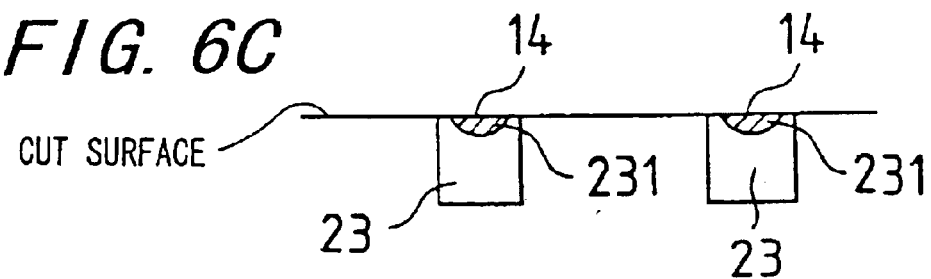
Figure 6D:
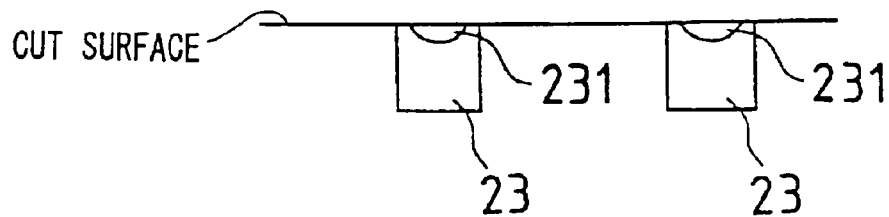

As shown in FIG. 6B, a filler 14 is charged in each of the terminal holes 231 shown in FIG. 6A. After curing the filler 14, as shown in FIG. 5A, the base material 1 is severed while a blade 2a, incorporated in a dicing machine, is being moved along a line located so as to be deviated to the cutout-portion side with respect to the cutting line covering the terminal hole 231. By being severed along a line located so as to be deviated to the cutout-portion side with respect to the cutting line, i.e., along a line which is offset from the cutting line and located in an unnecessary portion between the adjacent semiconductor apparatuses 21, the divisible multi-segment base material 1 is divided into separate semiconductor apparatuses 21. As shown in FIG. 6C, the terminal hole 231 is left exposed along the cut surface of each of the separate semiconductor apparatuses 21. Then, chilled water is applied to the filler 14 filled in the terminal hole 231, whereupon the filler 14 is removed from the terminal hole 231 as shown in FIG. 6D. Eventually, a multiplicity of semiconductor apparatuses 21 are produced. It should be noted that the above embodiment is implemented on the assumption that a permissible deviation would exist between the predetermined cutting line and the actual cutting line due to variations in the apparatuses or materials. Thus, in a post process, no additional cutting operation is carried out in conformity with the predetermined cutting line.

As described hereinabove, since one part of the terminal hole 231 removed as a result of severing the base material 1 is made larger in volumetric capacity than the other part thereof remaining on the semiconductor apparatus 21, even if the position at which the base material 1 is severed is deviated to the cutout portion side with respect to the predetermined position, the base material 1 can be severed without peeling off the plating applied to the terminal hole 231. This makes it possible to prevent burrs from being produced along the cut surface of the terminal portion 23 at the time of severing the base material 1. Moreover, the filler 14 used to prevent occurrence of burrs is removed just after the severing, thus leaving no unnecessary components in the semiconductor apparatus 21.

Figure 7A:
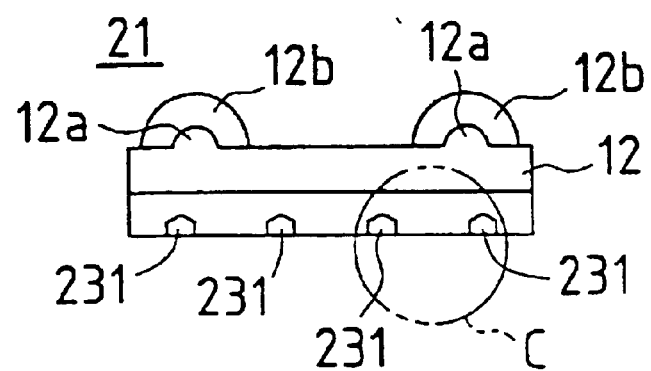
FIG. 7A is a side view showing the semiconductor apparatus according to the second embodiment of the invention.
Figure 7B:
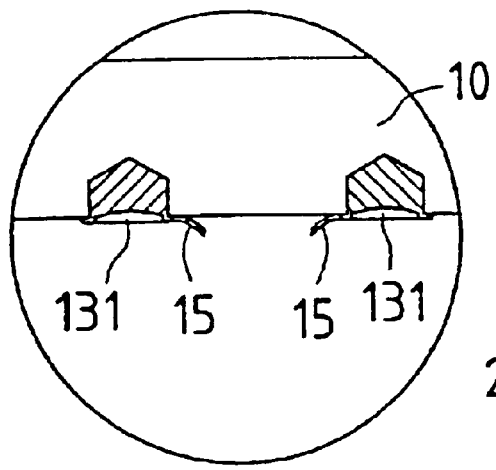
FIG. 7B is an enlarged side view showing the semiconductor apparatus, as viewed when the base material shown in FIG. 5C is severed.
Figure 7C:
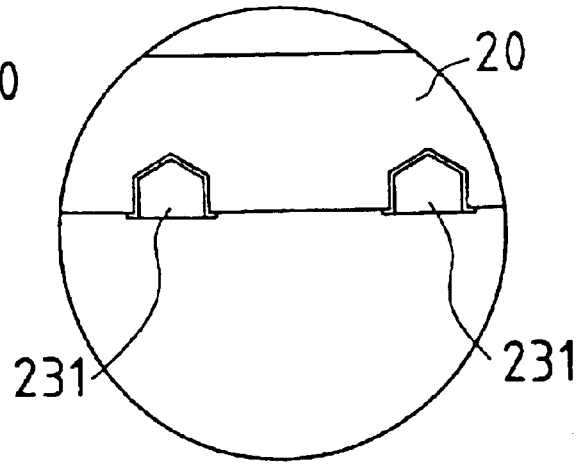
FIG. 7C is an enlarged side view showing a section C depicted in FIG. 6A.
Figure 8A:
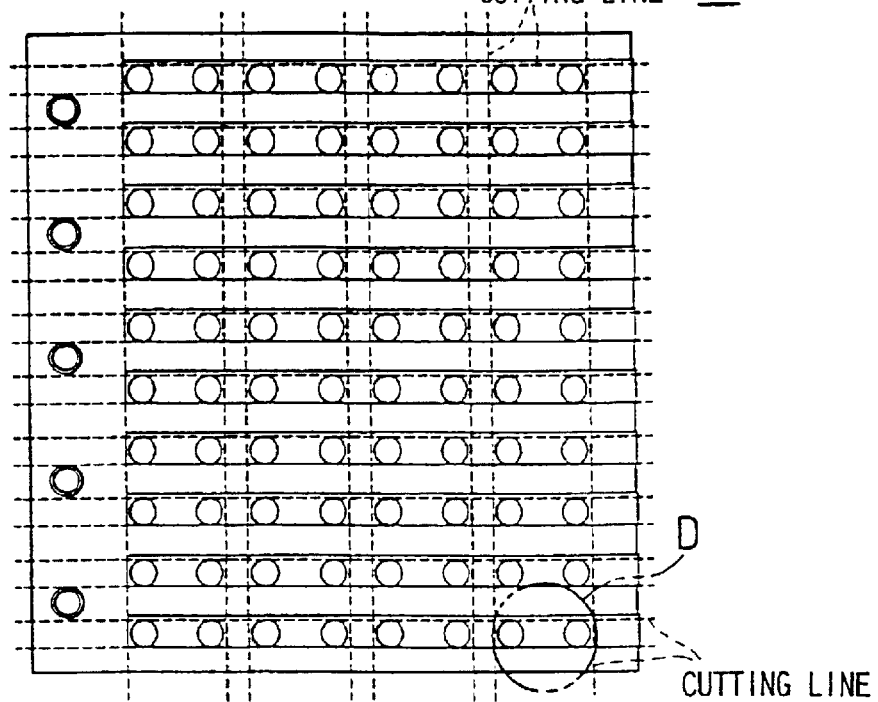
FIGS. 8A through 8C are views each showing a divisible multi-segment base material of conventional design, for use in manufacturing a multiplicity of semiconductor apparatuses.
Figure 8B:
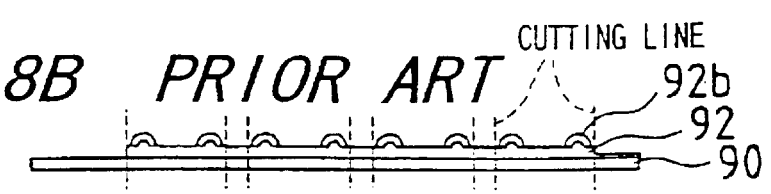
Figure 8C:
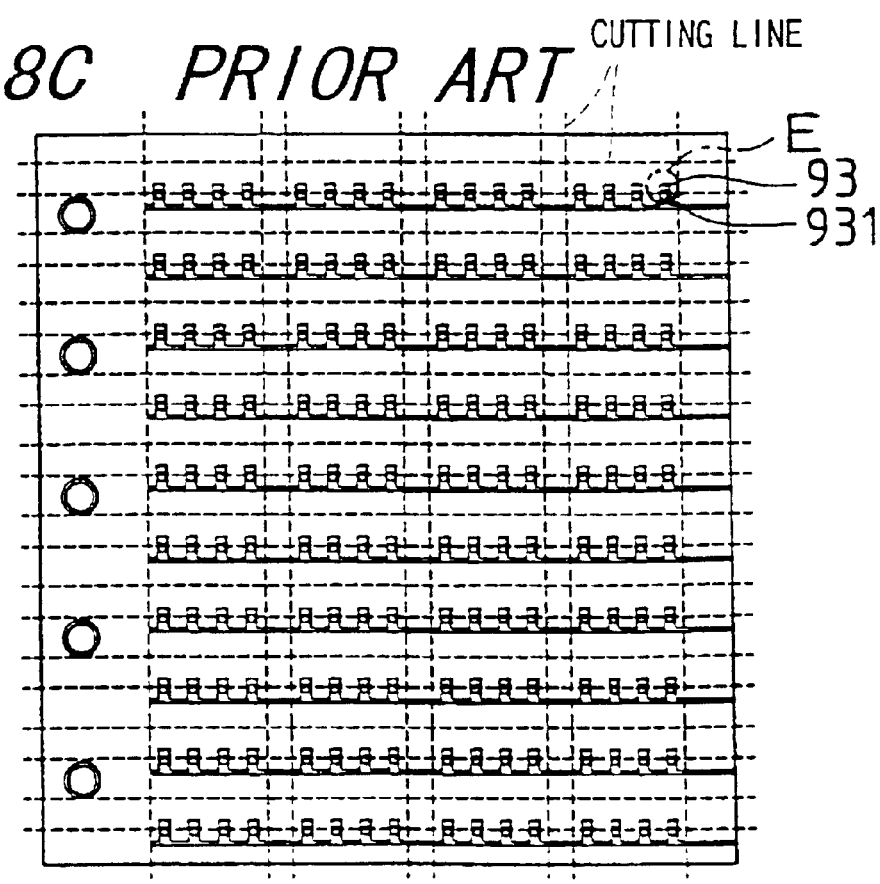
Figure 9A:
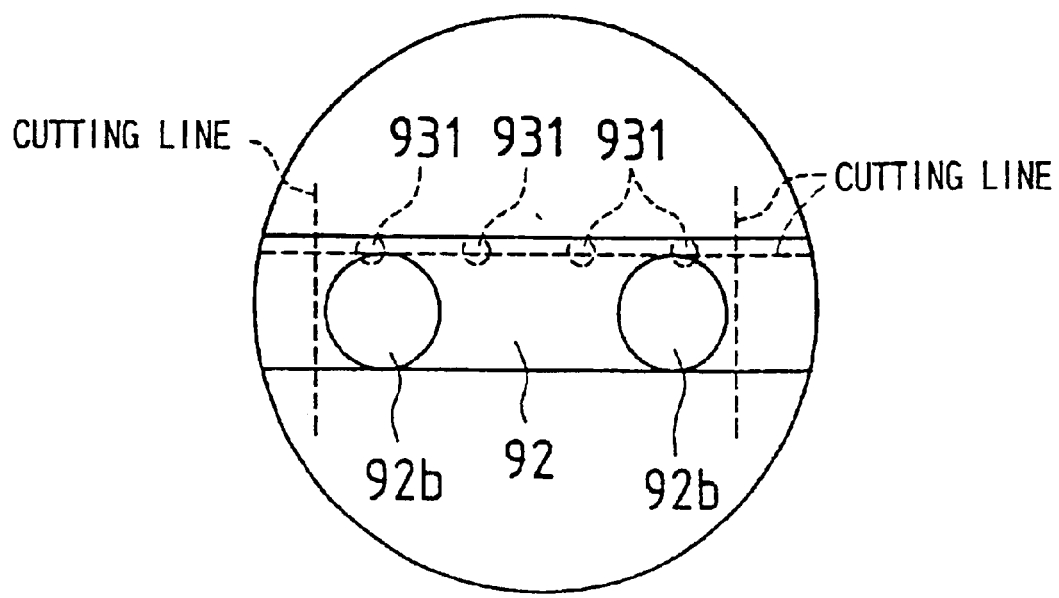
FIG. 9A is an enlarged view showing a section D depicted in FIG. 8A.
Figure 9B:
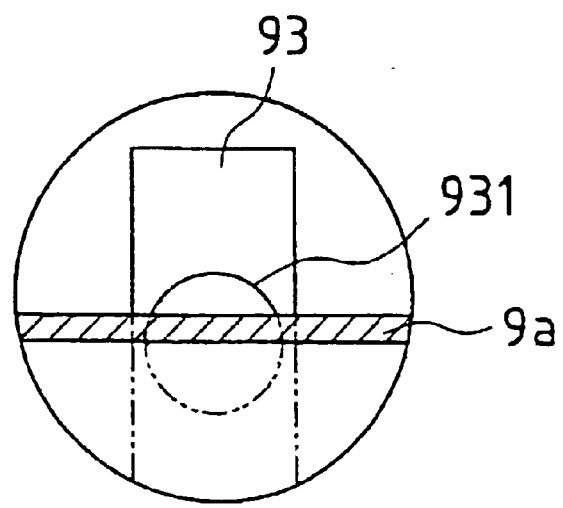
FIG. 9B is an enlarged view showing a section E depicted in FIG. 8C.
Figure 10A:
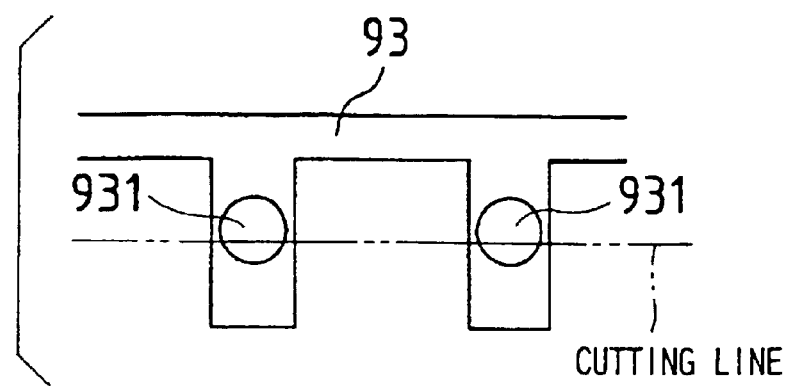
FIGS. 10A and 10B are views each showing a process step for manufacturing a conventional semiconductor apparatus 91.
Figure 10B:
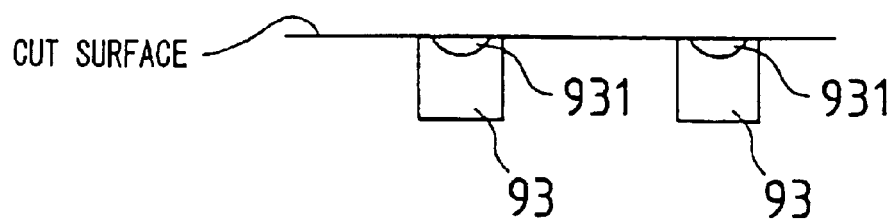
Figure 11A:
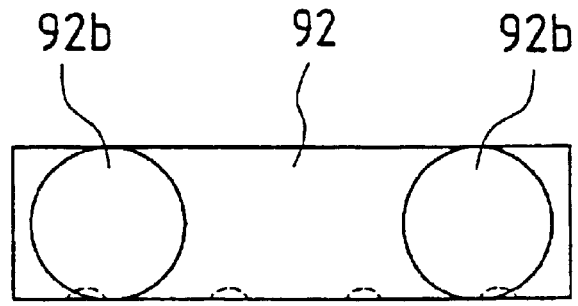
FIGS. 11A through 11C are views each showing the conventional semiconductor apparatus 91.
Figure 11B:
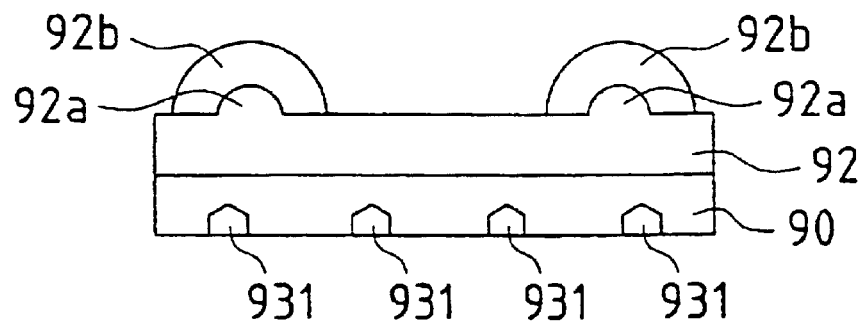
Figure 11C:
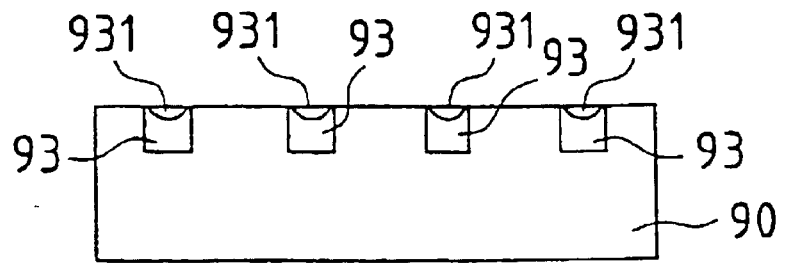
Figure 12A:
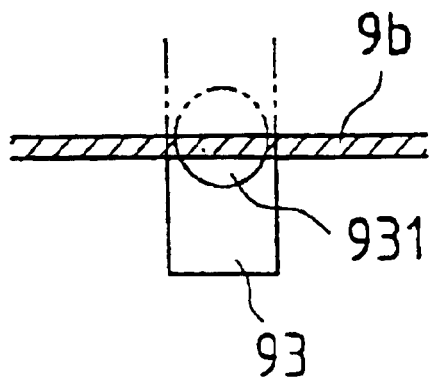
FIG. 12A is a view showing a state in which a base material is being severed with use of a single-type blade.
Figure 12B:
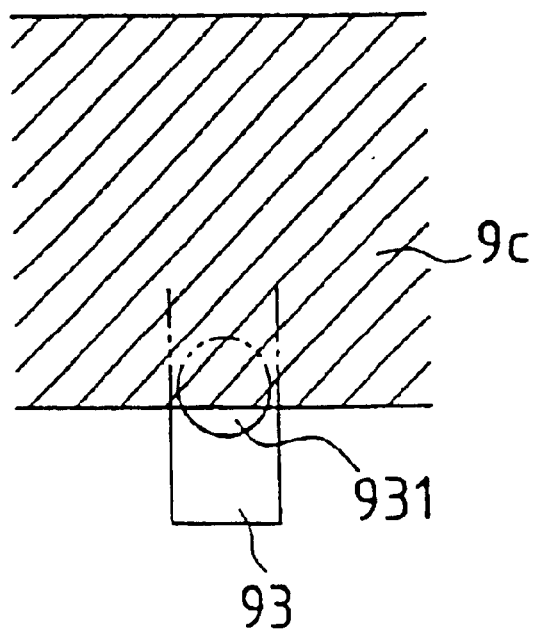
FIG. 12B is a view showing a state in which a base material is being severed with use of a multiple-type blade.

FIG. 5C is a view of the base material 1 having the circular terminal hole 131 according to the first embodiment of the invention, illustrating the case of severing the base material 1 along a line located so as to be deviated to the cutout-portion side with respect to the cutting line covering the terminal hole 131; FIG. 7A is a side view showing the semiconductor apparatus 21 according to the second embodiment of the invention; FIG. 7B is an enlarged side view showing the semiconductor apparatus, as viewed when the base material 1 shown in FIG. 5C is severed; and FIG. 7C is an enlarged view showing a section C depicted in FIG. 7A.

More specifically, for example, as shown in FIG. 5C, when the base material 1 having the terminal hole 131 of predetermined shape is severed along a line located so as to be deviated to the cutout-portion side with respect to the predetermined cutting position, the plating applied to the terminal hole 131 inconveniently comes off in and around the terminal hole 131, resulting in burrs 15 being produced along the cut surface, as shown in FIG. 7B. By contrast, the semiconductor apparatus 21 of the second embodiment according to the invention is free from burrs as shown in FIG. 7B. That is, as shown in FIG. 7C, it never occurs that burrs are produced along the cut surface because of the peeling off of the plating applied to the terminal hole 231.

As described heretofore, since the terminal hole 231 is formed by continuously drilling a plurality of terminal holes 131, its hole diameter is made larger than that of the terminal hole 131 of the first embodiment of the invention. As a result, even if the position at which the base material 1 is severed is deviated to the cutout portion side with respect to the predetermined position, the base material 1 can be severed without peeling off the plating applied to the terminal hole 231.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A semiconductor apparatus manufacturing method comprising the steps of:
    forming a divisible multi-segment base material by mounting a multiplicity of semiconductor chips on a top-surface side of a substrate having a wiring pattern, followed by sealing the semiconductor chips with resin, further followed by attaching terminal portions each having a terminal hole to a back-surface side of the substrate; and
    severing the base material at a position covering the terminal hole in such a way that the base material is divided into separate semiconductor apparatuses,
    wherein, after formation of the base material, a filler is charged in each of the terminal holes, then the base material is severed after curing the filler, and lastly the filler filled in each of the terminal holes is removed,
    wherein the filler contains a water-soluble substance,
    wherein the water-soluble substance consists of barium hydroxide or polyvinyl alcohol.

2. The semiconductor apparatus manufacturing method of claim 1,
    wherein the filler contains a thermosetting substance.

3. The semiconductor apparatus manufacturing method of claim 1,
    wherein the filler contains an ultraviolet cure substance.

4. The semiconductor apparatus manufacturing method of claim 1, wherein the terminal hole is formed by drilling a plurality of continuous holes.

5. The semiconductor apparatus manufacturing method of claim 1, wherein the terminal hole is shaped like a slot.

6. The semiconductor apparatus manufacturing method of claim 4, wherein the base material is severed in such a way that one part of the terminal hole removed as a result of severing the base material is made larger in volumetric capacity than the other part therof remaining on the semiconductor apparatus.

7. The semiconductor apparatus manufacturing method of claim 5, wherein the base material is severed in such a way that one part of the terminal hole removed as a result of severing the base material is made larger in volumetric capacity than the other part thereof remaining on the semiconductor apparatus.

* * * * *